(12) United States Patent
Li et al.

(10) Patent No.: US 12,163,989 B2
(45) Date of Patent: Dec. 10, 2024

(54) HIGH-FREQUENCY COMPONENT TEST DEVICE AND METHOD THEREOF

(71) Applicant: INDUSTRIAL TECHNOLOGY RESEARCH INSTITUTE, Hsinchu (TW)

(72) Inventors: Sih-Han Li, New Taipei (TW); Jie Zhang, New Taipei (TW); Peng-I Mei, Ji'an Township (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 441 days.

(21) Appl. No.: 17/559,371

(22) Filed: Dec. 22, 2021

(65) Prior Publication Data

US 2022/0341978 A1 Oct. 27, 2022

Related U.S. Application Data

(60) Provisional application No. 63/179,597, filed on Apr. 26, 2021.

(30) Foreign Application Priority Data

Nov. 11, 2021 (TW) ................................. 110142087

(51) Int. Cl.
  *G01R 27/32* (2006.01)
  *G01R 35/00* (2006.01)
(52) U.S. Cl.
  CPC ............ *G01R 27/32* (2013.01); *G01R 35/005* (2013.01)
(58) Field of Classification Search
  CPC ....... G01R 27/32; G01R 35/005; G01R 31/26
  See application file for complete search history.

(56) References Cited

U.S. PATENT DOCUMENTS 6,665,628 B2 12/2003 Martens
7,019,535 B2  3/2006 Adamian
(Continued)

FOREIGN PATENT DOCUMENTS

CN    103329256 B    9/2016
CN    107330184 A    11/2017
(Continued)

OTHER PUBLICATIONS

Jarry et al. "Advanced Design Techniques and Realizations of Microwave and RF Filters", 2008 John Wiley & Sons, Inc. (Year: 2008).*

(Continued)

*Primary Examiner* — Alexander Satanovsky
*Assistant Examiner* — Asm Fakhruddin
(74) *Attorney, Agent, or Firm* — Birch, Stewart, Kolasch & Birch, LLP

(57) ABSTRACT

A high-frequency component test device including a test key and a test module is provided. The test key includes a front-level key and a back-level key which are arranged symmetrically and have the same electrical length and characteristic impedance. The test module is used to measure an S parameter of the front-level key and the back-level key connected directly and an S parameter of a structure where a device under test (DUT) is added between the front-level key and the back-level key. The test module performs S parameter calculation in the frequency domain and converts the S parameter into an ABCD parameter matrix, and then obtains an ABCD parameter of a de-embedded DUT using a matrix root-opening operation and an inverse matrix operation.

10 Claims, 4 Drawing Sheets

(56) References Cited

U.S. PATENT DOCUMENTS

| | | | |
|---|---|---|---|
| 8,026,596 B2 | 9/2011 | Singhal et al. | |
| 8,436,626 B2 | 5/2013 | Cho | |
| 8,798,953 B2 | 8/2014 | Huang | |
| 9,318,417 B2 | 4/2016 | Therrien et al. | |
| 9,658,275 B2 | 5/2017 | Yen et al. | |
| 10,312,358 B2 | 6/2019 | Ren et al. | |
| 2005/0027469 A1* | 2/2005 | Brunsman | G01R 27/28 702/117 |
| 2005/0067716 A1 | 3/2005 | Mishra et al. | |
| 2006/0052962 A1 | 3/2006 | Shipton et al. | |
| 2010/0315115 A1* | 12/2010 | Lee | H01L 29/4908 324/762.01 |
| 2011/0267087 A1 | 11/2011 | Huang | |
| 2019/0285676 A1 | 9/2019 | Groves et al. | |

FOREIGN PATENT DOCUMENTS

| | | |
|---|---|---|
| CN | 108627896 A | 10/2018 |
| CN | 106503293 B | 11/2018 |
| CN | 109804256 A | 5/2019 |
| CN | 110703054 A | 1/2020 |
| CN | 111581903 A | 8/2020 |
| CN | 111929558 A | 11/2020 |
| CN | 112305480 A | 2/2021 |
| JP | 2011-192836 A | 9/2011 |
| JP | 2012042381 A * | 3/2012 ............ G01R 31/28 |
| TW | I385788 B | 2/2013 |

OTHER PUBLICATIONS

Taiwanese Office Action and Search Report for Taiwanese Application No. 110142087, dated Nov. 24, 2022.
Li et al., "A Thru-Halfthru-Short De-Embedding Method for Millimeter-Wave On-Wafer HBT Characterization", IEEE Electron Device Letters, vol. 38, No. 6, Jun. 2017, p. 720-723.
Lin et al., "An Extended De-embedding Method for On-Wafer Components", IEEE 2011, p. 166-168.
Loo et al., "A Cascade-Parallel Based Noise De-Embedding Technique for RF Modeling of CMOS Device", IEEE Microwave and Wireless Components Letters, vol. 21, No. 8, Aug. 2011, p. 448-450.
Troels Emil Kolding "On-Wafer Calibration Techniques for Giga-Hertz CMOS Measurements" Proc. IEEE 1999 Int. Conf. on Microelectronic Test Structures, vol. 12, Mar. 1999, p. 105-110.
Vincenzi et al., "Open-Thru de-embedding for Graphene RF devices", IEEE 2014, total 4 pages.

* cited by examiner

HIGH-FREQUENCY COMPONENT TEST DEVICE AND METHOD THEREOF

This application claims the benefits of U.S. provisional application Ser. No. 63/179,597, filed Apr. 26, 2021 and Taiwan application Serial No. 110142087, filed Nov. 11, 2021, the subject matters of which are incorporated herein by reference.

BACKGROUND

Technical Field

The disclosure relates in general to a test device, and more particularly to a high-frequency component test device and a test method thereof.

Description of the Related Art

Conventional measurement and calibration of a high-frequency component mainly uses SOLT or TRL. SOLT requires four calibration kits including short, open, thru and load kits. TRL requires three set of test keys including thru, reflect and line keys. The above calibration technologies normally use different calibration methods in response to specific measurement requirements (such as broadband frequency or on-wafer probing), making the calibration steps more complicated.

Additionally, the calibration result of the calibration method using SOLT or TRL may easily be affected by the error generated in each measurement. For example, the calibration result will be affected when the probing depth differs or when the probing position is offset. Therefore, it has become a prominent task for the industries to provide a solution capable of avoiding inaccurate measurement of the device under test (DUT) caused by calibration error.

SUMMARY

The disclosure is directed to a high-frequency component test device and a method thereof capable of reducing calibration error.

According to one embodiment of the present disclosure, a high-frequency component test device including a test key and a test module is provided. The test key includes a front-level key and a back-level key which are arranged symmetrically and have the same electrical length and characteristic impedance. The test module is used to measure an S parameter of the front-level key and the back-level key connected directly and an S parameter of a structure where a device under test (DUT) is added between the front-level key and the back-level key.

According to another embodiment of the present disclosure, a high-frequency component test method is provided. The high-frequency component test method includes the following steps. A test key including a front-level key and a back-level key is provided, wherein the front-level key and the back-level key are arranged symmetrically and have the same electrical length and characteristic impedance. An S parameter of the front-level key and the back-level key connected directly and an S parameter of a structure where a device under test (DUT) is added between the front-level key and the back-level key are measured. The S parameter calculation is performed in the frequency domain and the S parameter is converted into an ABCD parameter matrix, and then an ABCD parameter matrix of the front-level key and the back-level key is obtained using a root-opening operation. An ABCD parameter of a de-embedded DUT is calculated according to an inverse matrix of the ABCD parameter matrix of the front-level key and the back-level key.

The above and other aspects of the disclosure will become better understood with regard to the following detailed description of the preferred but non-limiting embodiment(s). The following description is made with reference to the accompanying drawings.

DETAILED DESCRIPTION

Technical solutions for the embodiments of the present disclosure are clearly and thoroughly disclosed with accompanying drawings. Obviously, the embodiments disclosed below are only some rather than all of the embodiments of the present disclosure. Besides, the disclosed features, structures or characteristics can be combined in one or more embodiments in any suitable way. In the following disclosure, many detailed descriptions are provided for the embodiments of the present disclosure to be better and fully understood. However, anyone ordinarily skilled in the art of the disclosure will understand that technical solution for the present disclosure can be implemented without one or some of the specific details disclosed below or can be implemented using other methods, devices, or steps. In some circumstances, generally known methods, devices, implementations, or operations of the technical solution capable of implementing the present disclosure are not necessarily illustrated or disclosed in greater details lest the aspects of the present disclosure might be distracted.

Figure 2:
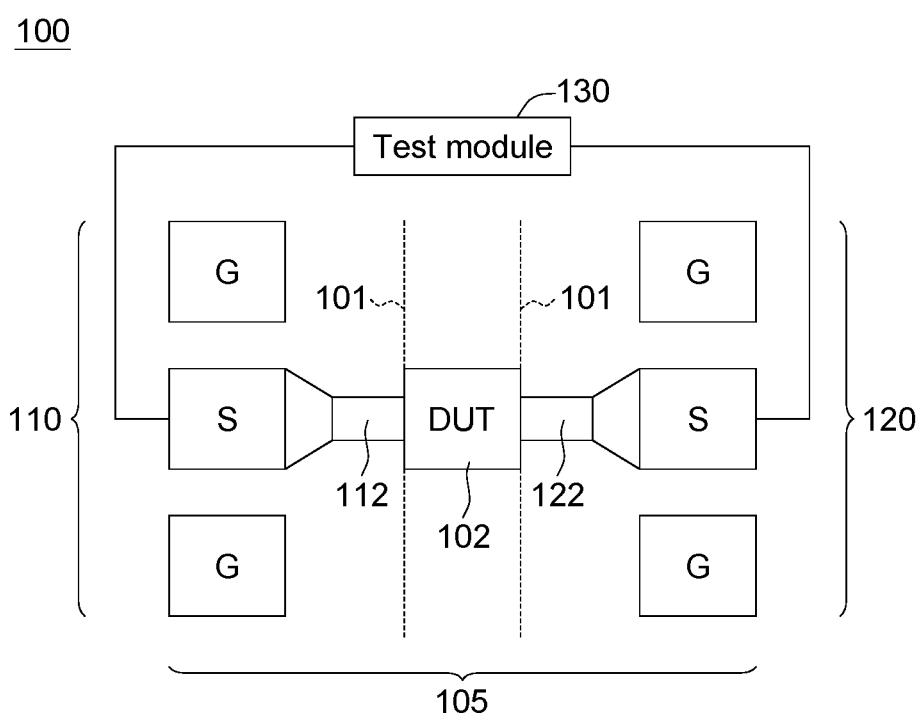

In the present embodiment, high-frequency performance of a device such as a radio frequency emitter or a microwave device is represented by a scattering parameter (S parameter). The current S parameter test device generates a large parasitic effect, so that the S parameter obtained by an under-test high-frequency component cannot correctly represent the performance of the high-frequency component. Thus, a test key is disposed on the test device of the present embodiment to define a de-embedded plane 101 of the high-frequency component, that is, the plane between the intrinsic component (DUT 102) and the parasitic component (test device 100) as indicated in FIG. 2. By removing the parasitic effect generated by the test device in a high-frequency working state, an accurate intrinsic transmission parameter will be obtained.

Figure 1:
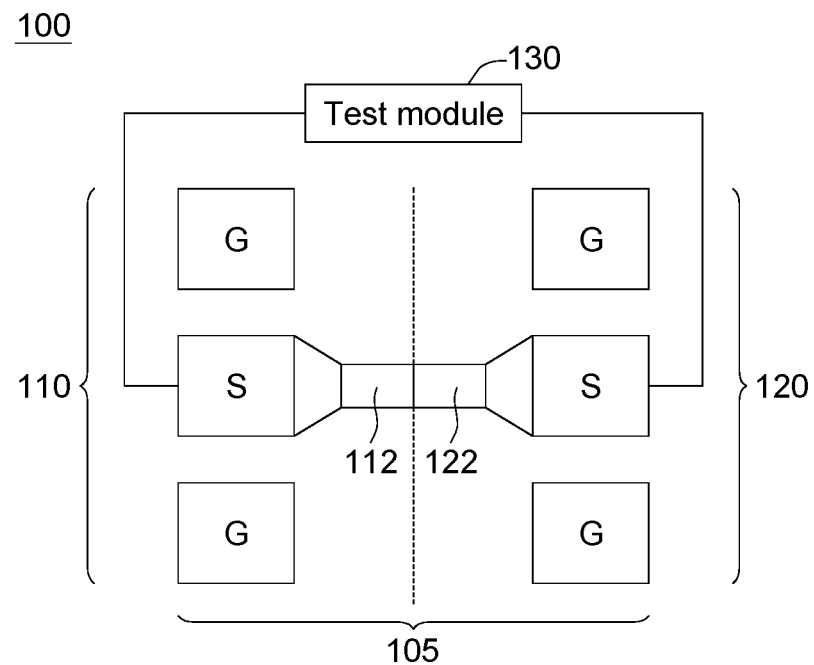
FIGS. 1 and 2 respectively are schematic diagrams of a high-frequency component test device according to an embodiment of the present disclosure.

Referring to FIGS. 1 and 2, schematic diagrams of a high-frequency component test device 100 according to an embodiment of the present disclosure are respectively shown. In FIG. 1, the high-frequency component test device 100 includes a test key 105 and a test module 130. The test key 105 includes a front-level key 110 and a back-level key 120. The front-level key 110 and the back-level key 120 are symmetrically arranged and have the same electrical length and characteristic impedance. In an embodiment, the front-level key 110 and the back-level key 120 exemplarily have a characteristic impedance of 50Ω, but the present disclosure is not limited thereto. The front-level key 110 and the back-level key 120 can be disposed according to a ground-signal-ground (GSG) configuration. In another embodiment, the front-level key 110 and the back-level key 120 are disposed by a ground-signal (GS) configuration, a ground-signal—ground-signal-ground (GSGSG) configuration or other suitable test configuration. The test module 130 can be a network analyzer.

The front-level key 110 includes a first transmission line 112. The back-level key 120 includes a second transmission line 122. The first transmission line 112 and the second transmission line 122 have the same electrical length and material, such that the transmission parameters on the two sides of the front and the rear are substantially identical. In FIG. 2, the DUT 102 is connected between two transmission lines 112 and 122. A de-embedded plane 101 is respectively formed between the DUT 102 and the first transmission line 112 and between the DUT 102 and the second transmission line 122 (the de-embedded plane 101 is perpendicular to the paper surface), such that the DUT 102 is connected between two de-embedded planes 101. The left-hand structure and the right-hand structure of the de-embedded plane 101 respectively have an intrinsic transmission parameter. The intrinsic transmission parameter of the DUT 102 can be estimated according to the intrinsic transmission parameters of the left-hand structure and the right-hand structure and the transmission parameter of the structure under test. In an embodiment, the intrinsic transmission parameter is represented by an ABCD parameter, for example.

In the present embodiment, the parameter conversion module converts the S parameter into an ABCD parameter, wherein when the front-level key 110 and the back-level key 120 are connected directly, the S parameter can be represented by an ABCD parameter, such as parameter matrix $$\begin{bmatrix} A & B \\ C & D \end{bmatrix}.$$

For example, when the front-level key 110 and the back-level key 120 are connected directly, a total voltage V1 and a total current I1 are inputted to one end of the two-port network, and a total voltage V2 and a total current I2 are outputted from the other end of the two-port network, wherein V1=AV2+BI2, I1=CV2+DI2, that is, $$\begin{bmatrix} V1 \\ I1 \end{bmatrix} = \begin{bmatrix} A & B \\ C & D \end{bmatrix} \begin{bmatrix} V2 \\ I2 \end{bmatrix},$$

wherein the relationship among the input voltage V1, the output voltage V2, the input current I1 and the output current I2 is represented by parameters A, B, C and D.

The test module 130 of the present embodiment can obtain the ABCD parameter of the front-level key 110 and the back-level key 120 according to a root-opening operation of the ABCD parameter matrix, and the calculation formula (1) can be expressed as: [Dem]=[PAD][PAD], wherein [PAD] is an ABCD parameter matrix of the front-level key 110 and the back-level key 120; [Dem] is an ABCD parameter matrix when the front-level key 110 and the back-level key 120 are connected directly. In the present embodiment, since the front-level key 110 and the back-level key 120 have the same electrical length and charac- teristic impedance, the front-level key 110 and the back-level key 120 have the same ABCD parameter matrix. Therefore, the ABCD parameter matrix [PAD] of the front-level key 110 and the back-level key 120 can be obtained by performing a root-opening operation on the ABCD parameter matrix [Dem] of the two directly connected keys 110 and 120 according to formula (1): [PAD]=√[Dem].

Also, refer to FIG. 2. When a device under test (DUT) 102 is added between the front-level key 110 and the back-level key 120, the test module 130 measures the S parameter of the structure under test where the DUT 102 is added between the front-level key 110 and the back-level key 120. Then, the test module 130 converts the S parameter into an ABCD parameter, and then obtains the ABCD parameter of a de-embedded DUT 102 according to an inverse matrix. The calculation formula (2) is expressed as: [DUT]=[PAD][Golden][PAD], wherein [Golden] is an ABCD parameter matrix of the de-embedded DUT 102; [DUT] is an ABCD parameter matrix when the front-level key 110 and the back-level key 120 are directly connected to the DUT 102. Based on formula (2), [Golden]=[PAD]$^{-1}$[DUT][PAD]$^{-1}$, wherein [PAD]$^{-1}$ is an inverse matrix of the ABCD parameter matrix of the front-level key 110 and the back-level key 120, that is, [PAD]$^{-1}$=(√[Dem])$^{-1}$.

In the present embodiment, with only one set of de-embedded test keys, the high-frequency component test device 100 can remove the parasitic effect of extra layout and tracing caused by measurement, not only increasing the de-embedded test speed and accuracy but also reducing probing error.

Figure 3:
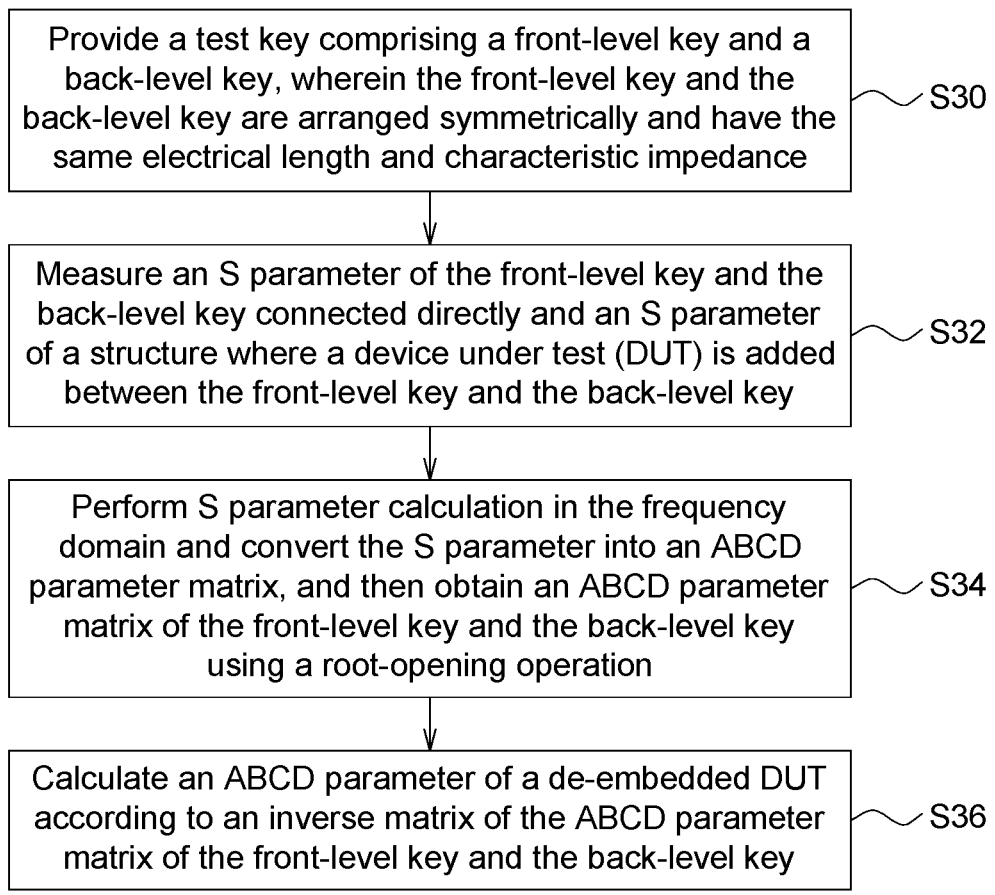
FIG. 3 is a flowchart of a high-frequency component test method according to an embodiment of the present disclosure.

Refer to FIGS. 1-3. FIG. 3 is a flowchart of a high-frequency component test method according to an embodiment of the present disclosure. Firstly, in step S30, a test key 105 comprising a front-level key 110 and a back-level key 120 is provided, the front-level key 110 and the back-level key 120 are arranged symmetrically and have the same electrical length and characteristic impedance. In step S32, an S parameter of the front-level key 110 and the back-level key 120 connected directly and an S parameter of a structure where a device under test (DUT) 102 is added between the front-level key 110 and the back-level key 120 are measured. In step S34, the S parameter calculation is performed in the frequency domain and the S parameter is converted into an ABCD parameter matrix, and then an ABCD parameter matrix of the front-level key 110 and the back-level key 120 is obtained using a root-opening operation. In step S36, an ABCD parameter of a de-embedded DUT 102 is calculated according to an inverse matrix of the ABCD parameter matrix of the front-level key 110 and the back-level key 120.

Figure 4A:
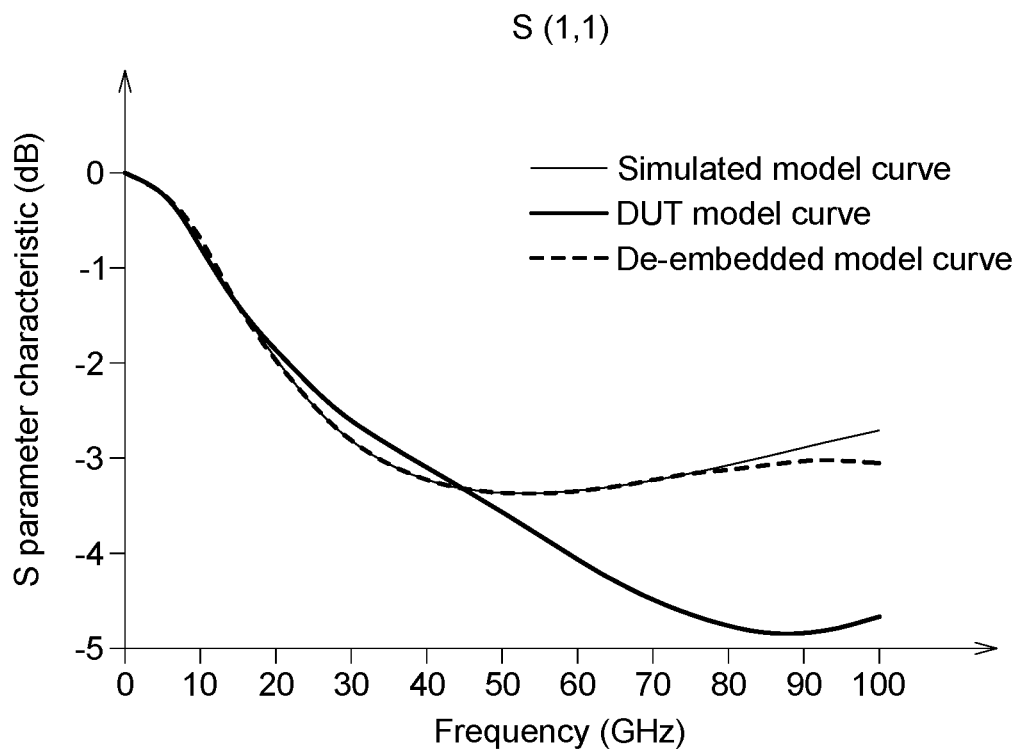
FIGS. 4A-4D respectively are schematic diagrams illustrating characteristic verification of a high-frequency component test device according to an embodiment of the present disclosure.
Figure 4B:
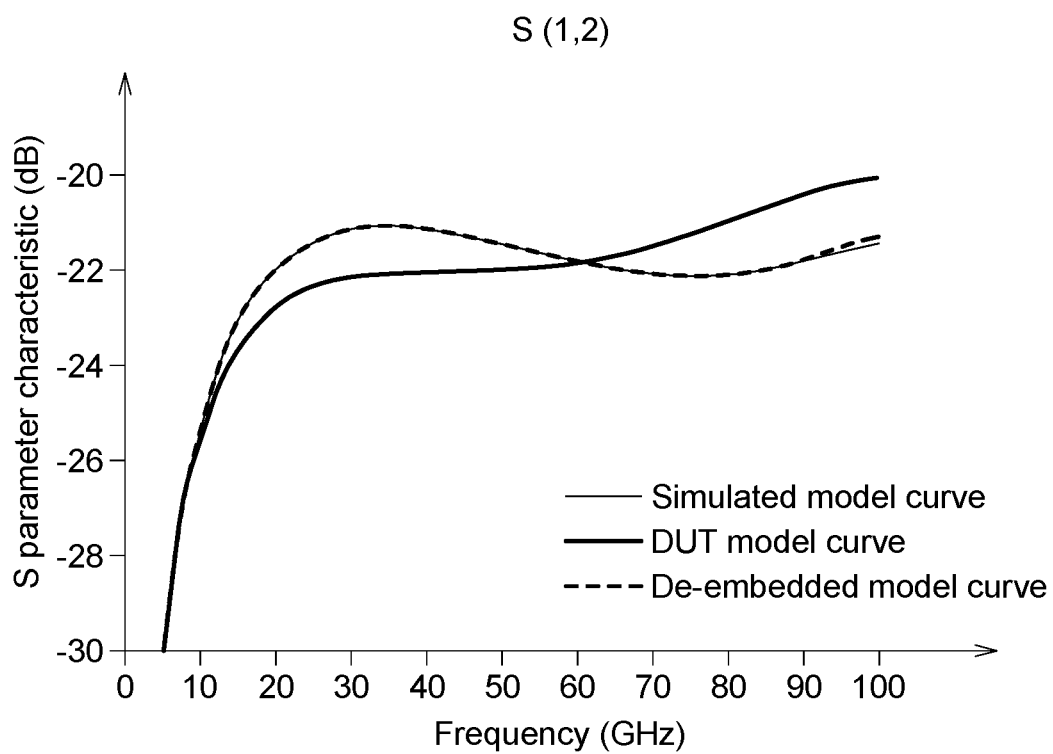
Figure 4C:
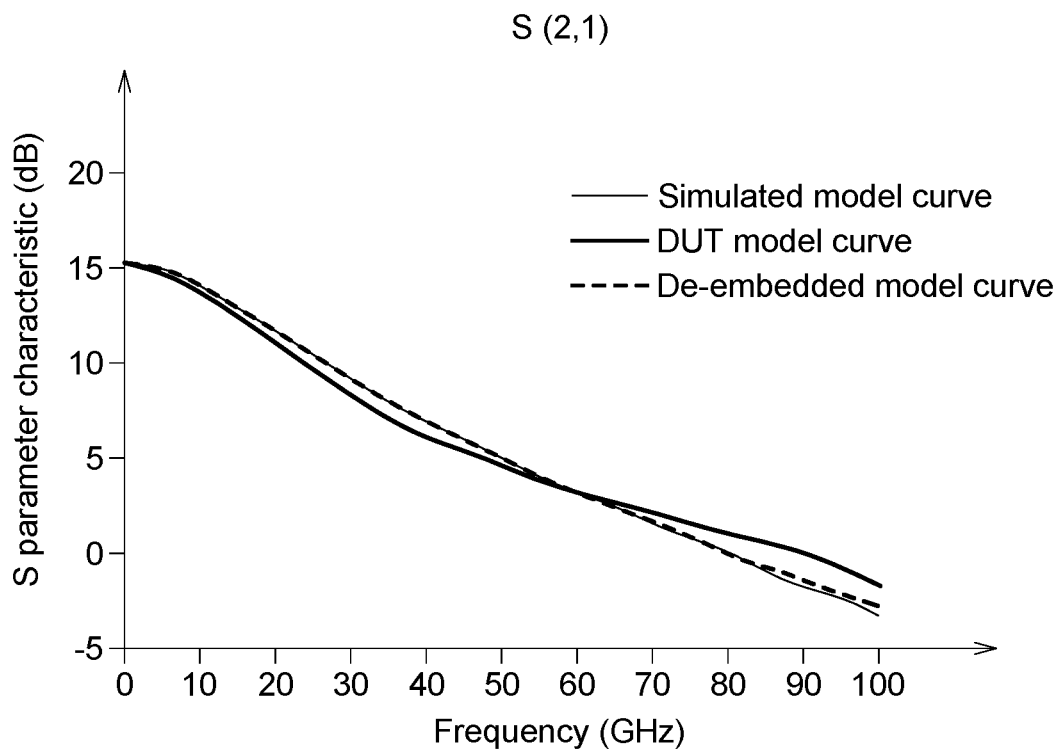
Figure 4D:
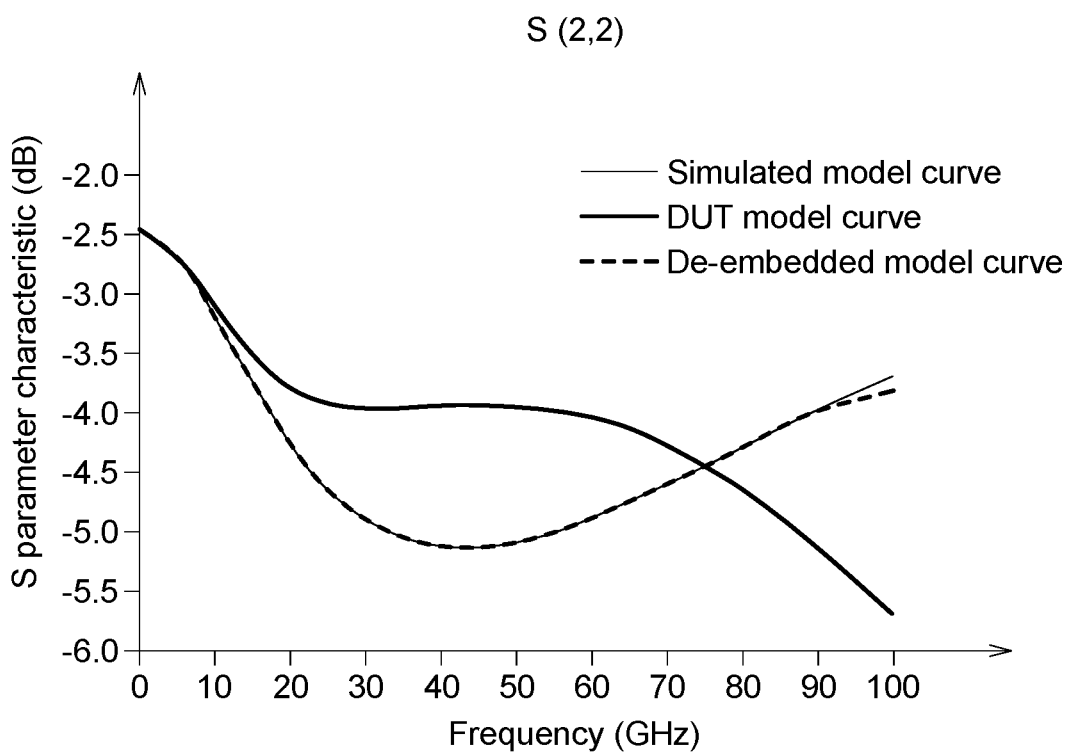

Referring FIGS. 4A-4D, schematic diagrams illustrating characteristic verification of S parameter of a high-frequency component test device 100 according to an embodiment of the present disclosure are respectively shown. In FIG. 4A, S(1,1) parameter is an input reflection coefficient, that is, an input return loss. In FIG. 4B, S(1,2) parameter is a reverse transmission coefficient, that is, isolation. In FIG. 4C, S(2,1) parameter is a forward transmission coefficient, that is, gain. In FIG. 4D, S(2,2) parameter is an output reflection coefficient, that is, an output return loss. In the present embodiment, feasibility and characteristic verification of S parameter are verified using simulation, and a comparison between the simulated model curve, DUT model curve and de-embedded model curve shows that an intrinsic transmission parameter close to the DUT 102 can be obtained using the de-embedded procedure of the present embodiment. Simulation is performed until the error in the curve fitting of 100 GHz small signal is less than 10%. In another embodiment, when the verification is performed using the transmission key and the test key, simulation is performed until the error in the characteristic impedance Z0 and transmission line length βL of the 67 GHz small signal phase can be less than 8%.

According to the high-frequency component test device and the test method thereof disclosed in above embodiments of the present disclosure, only one test key is used as calibration kit, the front-level key and the back-level key of the test key have the same electrical length and characteristic impedance, the characteristic impedance is 50Ω being the same as the impedance of the probe, hence avoiding inaccurate measurement of the DUT caused by calibration error. In comparison to the conventional measurement and calibration of a high-frequency component which mainly use SOLT or TRL, the method of the present embodiment can reduce calibration steps and remove the parasitic effect generated by the test device in a high-frequency working state, so as to obtain an accurate S parameter.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A high-frequency component test device, comprising:
a test key, comprising a front-level key and a back-level key, wherein the front-level key and the back-level key are arranged symmetrically and have a same electrical length and characteristic impedance; and
a test module used to measure an S parameter of the front-level key and the back-level key connected directly and an S parameter of a structure where a device under test (DUT) is added between the front-level key and the back-level key, wherein the test module performs S parameter calculation in the frequency domain and converts the S parameter into an ABCD parameter matrix, and then obtains an ABCD parameter of the de-embedded DUT using a matrix root-opening operation and an inverse matrix operation.

2. The test device according to claim 1, wherein the front-level key comprises a first transmission line, the back-level key comprises a second transmission line, the first transmission line and the second transmission line have the same characteristic impedance.

3. The test device according to claim 2, wherein the DUT is connected between the first transmission line and the second transmission line; a de-embedded plane is respectively formed between the DUT and the first transmission line and between the DUT and the second transmission line.

4. The test device according to claim 3, wherein [PAD] is an ABCD parameter matrix of the front-level key and the back-level key, [Dem] is an ABCD parameter matrix when the front-level key and the back-level key are connected directly, [Dem]=[PAD] [PAD], wherein the ABCD parameter matrix of the front-level key and the back-level key is expressed as: $[PAD]=\sqrt{[Dem]}$.

5. The test device according to claim 4, wherein [Golden] is an ABCD parameter matrix of the de-embedded DUT, [DUT] is an ABCD parameter matrix when the test key and the DUT are connected directly, [DUT]=[PAD] [Golden] [PAD], the ABCD parameter matrix of the de-embedded DUT is calculated according to an inverse matrix of the ABCD parameter matrix of the front-level key and the back-level key $[PAD]^{-1}$ and is expressed as: $[Golden]=[PAD]^{-1}[DUT][PAD]^{-1}$.

6. A high-frequency component test method, comprising:
providing a test key, comprising a front-level key and a back-level key, wherein the front-level key and the back-level key are arranged symmetrically and have a same electrical length and characteristic impedance;
measuring an S parameter of the front-level key and the back-level key connected directly and an S parameter of a structure where a device under test (DUT) is added between the front-level key and the back-level key;
performing S parameter calculation in the frequency domain and converting the S parameter into an ABCD parameter matrix, and then obtaining an ABCD parameter matrix of the front-level key and the back-level key using a root-opening operation; and
calculating an ABCD parameter of a de-embedded DUT according to an inverse matrix of the ABCD parameter matrix of the front-level key and the back-level key.

7. The test method according to claim 6, wherein the front-level key comprises a first transmission line; the back-level key comprises a second transmission line; the first transmission line and the second transmission line have the same characteristic impedance.

8. The test method according to claim 7, wherein the DUT is connected between the first transmission line and the second transmission line; a de-embedded plane is respectively formed between the DUT and the first transmission line and between the DUT and the second transmission line.

9. The test method according to claim 6, wherein [PAD] is an ABCD parameter matrix of the front-level key and the back-level key, [Dem] is an ABCD parameter matrix when the front-level key and the back-level key are connected directly, [Dem]=[PAD] [PAD], wherein the ABCD parameter matrix of the front-level key and the back-level key is expressed as: $[PAD]=\sqrt{[Dem]}$.

10. The test method according to claim 9, wherein [Golden] is an ABCD parameter matrix of the de-embedded DUT, [DUT] is an ABCD parameter matrix when the front-level key and the back-level key are directly connected to the DUT, [DUT]=[PAD] [Golden] [PAD], the ABCD parameter matrix of the de-embedded DUT is calculated according to an inverse matrix of the ABCD parameter matrix of the front-level key and the back-level key $[PAD]^{-1}$ and is expressed as $[Golden]=[PAD]^{-1}[DUT][PAD]^{-1}$.

* * * * *